(12) United States Patent
Horibe et al.

(10) Patent No.: US 9,721,812 B2
(45) Date of Patent: Aug. 1, 2017

(54) OPTICAL DEVICE WITH PRECOATED UNDERFILL

(71) Applicant: INTERNATIONAL BUSINESS MACHINES CORPORATION, Armonk, NY (US)

(72) Inventors: Akihiro Horibe, Kanagawa-ken (JP); Masao Tokunari, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/947,855

(22) Filed: Nov. 20, 2015

(65) Prior Publication Data
US 2017/0148646 A1  May 25, 2017

(51) Int. Cl.
| | |
|---|---|
| *H01L 21/00* | (2006.01) |
| *H01L 21/56* | (2006.01) |
| *H01L 25/00* | (2006.01) |
| *H01L 25/065* | (2006.01) |
| *H01L 23/31* | (2006.01) |
| *H01L 23/498* | (2006.01) |
| *H01L 21/48* | (2006.01) |

(52) U.S. Cl.
CPC ........ *H01L 21/563* (2013.01); *H01L 21/4853* (2013.01); *H01L 23/3178* (2013.01); *H01L 23/49811* (2013.01); *H01L 23/49838* (2013.01); *H01L 23/49894* (2013.01); *H01L 25/0657* (2013.01); *H01L 25/50* (2013.01); *H01L 2225/06524* (2013.01); *H01L 2225/06555* (2013.01)

(58) Field of Classification Search
None
See application file for complete search history.

(56) References Cited

U.S. PATENT DOCUMENTS

| | | | |
|---|---|---|---|
| 6,066,574 A * | 5/2000 | You | H01L 21/31058 257/E21.242 |
| 7,245,023 B1 * | 7/2007 | Lin | H01L 21/6835 257/779 |
| 7,538,415 B1 * | 5/2009 | Lin | H01L 21/4832 257/673 |

(Continued)

FOREIGN PATENT DOCUMENTS

DE        EP 0905797 A2 *   3/1999   ......... H01L 33/0079

OTHER PUBLICATIONS

Takahashi, T., M. G. Dibbs, and D. C. Frye. "Benzocyclobutene Resin for Thin Film Electronic Applications." Proceedings of the Japan International SAMPE Symposium. vol. 1. Japan Chapter of SAMPE, 1993.*

(Continued)

*Primary Examiner* — David E Graybill
(74) *Attorney, Agent, or Firm* — Tutunjian & Bitetto, P.C.; Vazken Alexanian

(57) ABSTRACT

A method for fabricating an optical multi-chip module (MCM) includes temporarily curing an underfill material on a chip including an optical device to prevent flow of the underfill material. The chip is flip-chip mounted on a waveguide module having a mirror for directing light to or from the chip, wherein the underfill material is disposed between the chip and the waveguide module. The underfill material is cured to adhere the chip to the waveguide module.

16 Claims, 2 Drawing Sheets

(56) References Cited

U.S. PATENT DOCUMENTS

| | | | | |
|---|---|---|---|---|
| 7,843,074 | B2* | 11/2010 | Gao | H01L 24/73 257/779 |
| 7,867,793 | B2* | 1/2011 | Basin | H01L 33/0079 257/E21.056 |
| 2004/0082107 | A1* | 4/2004 | Shi | C08L 63/00 438/108 |
| 2004/0159923 | A1* | 8/2004 | Skokov | C08G 61/02 257/678 |
| 2007/0029545 | A1* | 2/2007 | Striakhilev | H01L 27/3248 257/40 |
| 2009/0017566 | A1* | 1/2009 | Basin | H01L 33/0079 438/26 |
| 2009/0302429 | A1* | 12/2009 | Plossl | H01L 24/27 257/621 |
| 2010/0159644 | A1* | 6/2010 | Dunne | H01L 21/563 438/113 |
| 2011/0170266 | A1* | 7/2011 | Haensch | B32B 37/02 361/722 |
| 2011/0274388 | A1* | 11/2011 | Yamamoto | G02B 6/43 385/14 |
| 2013/0259421 | A1* | 10/2013 | Yamakami | B29D 11/00721 385/14 |
| 2013/0280861 | A1* | 10/2013 | Ma | H01L 21/563 438/107 |
| 2014/0169731 | A1* | 6/2014 | Yanagisawa | G02B 6/42 385/14 |
| 2015/0187720 | A1* | 7/2015 | Watanabe | H01L 24/81 257/738 |
| 2015/0277066 | A1* | 10/2015 | Nakagawa | G02B 3/0006 385/33 |
| 2015/0285995 | A1* | 10/2015 | Yamamoto | G02B 6/122 385/14 |
| 2016/0042979 | A1* | 2/2016 | Gaynes | H01L 22/20 438/12 |

OTHER PUBLICATIONS

Anonymous, "Method for self-writing a waveguide in the underfill to couple the substrate waveguide to the VCSEL and photodetector," ip.com, Apr. 2015. (pp. 1-5).

* cited by examiner

OPTICAL DEVICE WITH PRECOATED UNDERFILL

BACKGROUND

Technical Field

The present invention relates to optical devices, and more particularly to optical device integration using an underfill material to eliminate losses between a photonics device and an optical component.

Description of the Related Art

An optical multi-chip module (MCM) includes optical waveguides on an organic substrate where optical devices such as vertical cavity surface emitting laser (VCSEL) or photodiode (PD) chips are mounted. The light from/to the device is coupled with the optical waveguides via 45-degree mirrors, where total internal reflection (TIR) mirrors manufactured by laser ablation techniques are employed for high channel density applications.

The VCSEL/PD chips are encapsulated by an underfill when placed on the organic substrate. During production, the underfill material enters mirror cavities located on a same side as the chips so that the TIR mirrors do not function properly. Loss can also be caused by an inclination of the VCSEL/PD chips when electrodes are located slightly off a chip center and cannot be well-controlled when they are mounted.

SUMMARY

A method for fabricating an optical multi-chip module (MCM) includes temporarily curing an underfill material on a chip including an optical device to prevent flow of the underfill material. The chip is flip-chip mounted on a waveguide module having a mirror for directing light to or from the chip, wherein the underfill material is disposed between the chip and the waveguide module. The underfill material is cured to adhere the chip to the waveguide module.

Another method for fabricating an optical multi-chip module (MCM) includes depositing an underfill material over a wafer having a plurality of chips with raised electrodes, the plurality of chips including optical devices; removing the underfill material from the raised electrodes; temporarily curing the underfill material; dicing the wafer to separate the plurality of chips; flip-chip mounting a chip of the plurality of chips on a waveguide module having a mirror for directing light to or from the chip, wherein the underfill material is disposed between the chip and the waveguide module; and curing the underfill material to adhere the chip to the waveguide module.

An optical multi-chip module (MCM) includes a waveguide module having a cavity with a mirror. The mirror is configured to direct light into or from a waveguide formed in the waveguide module. A chip flip-chip is mounted on the waveguide module to have a light input or output formed on the chip aligned with the mirror. A reflowable underfill material is disposed between the chip and the waveguide module to adhere the chip to the waveguide module without filling the cavity.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
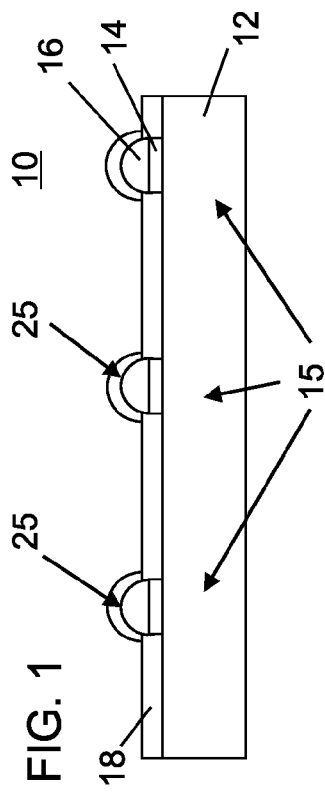
FIG. 1 is a side view of a wafer covered by an underfill material and having optical devices, such as, vertical cavity surface emitting laser (VCSEL) or photodiode (PD) chips formed therein with raised electrodes in accordance with the present principles.

In accordance with the present principles, structures and methods are provided for optical devices that are employed with infrared-transparent photosensitive thermal-curing underfill. The underfill may include, e.g., cyclotene resin, and may be pre-coated on optical chips or provided on optical waveguide-integrated organic substrates with total internal reflection (TIR) mirrors. Since the underfill is pre-coated and semi-cured in advance, there is no danger of filling mirror cavities. In addition, an optical path between the optical device and a waveguide is still filled with the underfill to eliminate any air gaps. The TIR mirror cavities remain open on the waveguides at a side where the devices are mounted, and are not filled with the underfill to maintain low-loss optical coupling. Use of transparent underfill fills between vertical cavity surface emitting laser (VCSEL) or photodiode (PD) (VCSEL/PD) chips and the waveguide, still results in loss reduction by eliminating air interface reflection in the gap space. In accordance with the present principles more precise control of the underfill area is provided.

A distance between the devices and the waveguides is minimized for low-loss optical coupling by removing the underfill at an electrode area of the device and using through-waveguide-vias instead of inserting flexible printed circuits between those two components for electric connection of the devices. The underfill thickness is also minimized, and no lens is employed on the optical device to further reduce cost.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as an organic carrier or a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a wafer 10 is shown for processing in accordance with one illustrative embodiment. The wafer 10 includes a plurality of chips 15 formed thereon. The chips 15 may include lasers, photodiodes or other light emitting or receiving devices, herein referred to as optical devices. In one embodiment, the chips 15 include vertical cavity surface emitting laser (VCSEL) chips or photodiode (PD) chips. The chips 15 include one or more pads or contacts 14 for making electrical connections to the chip 15. The contacts 14 may be deposited on the wafer 10 and patterned to shape the contacts 14. The deposition of the contacts 14 may include any process for forming metal including, e.g., sputtering, evaporation, chemical vapor deposition, etc. The contacts 14 may include a solder ball 16 formed thereon for making an electrical connection to other components as will be described. The contacts 14 and solder balls 16 will be collectively referred to as electrodes 25.

An underfill material or underfill 18 is formed over the wafer 10. The underfill 18 may include, e.g., cyclotene resin. The underfill 18 may be applied using a spin on process, although other processes may be employed to apply the underfill 18 on the wafer. The underfill thickness is adjustable by controlling a rotation speed of a spin coater. The thickness of the underfill 18 is provided in accordance with a gap distance needed between a chip and a waveguide.

Figure 2:
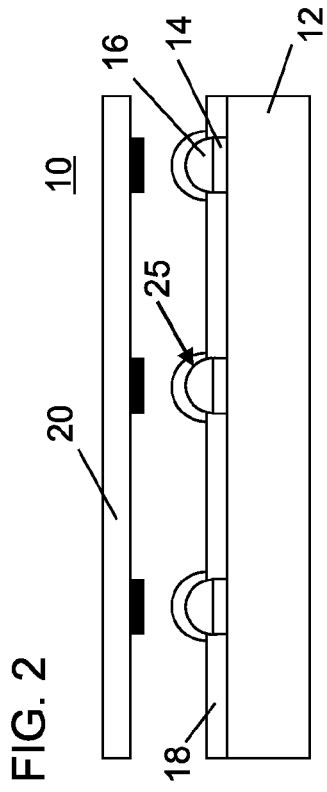
FIG. 2 is a side view of the wafer of FIG. 1 showing the underfill material of the wafer being processed with a mask during a lithography process to remove the underfill material from the raised electrodes in accordance with the present principles.

Referring to FIG. 2, after forming the underfill 18, a soft bake process may be performed to harden the underfill 18. In one embodiment, the wafer 10 with the underfill 18 is baked at a temperature of between about 60 degrees C. and about 80 degrees C. for about 90 seconds. The underfill 18 over the electrodes 25 is removed by a photolithography process. The photolithography process may include positioning a mask 20 over the wafer 10, exposing the underfill 18 to light in accordance with the mask 20 to cause crosslinking, and developing the underfill layer 18 to remove portions of the underfill 18 over the electrodes 25.

Figure 3:
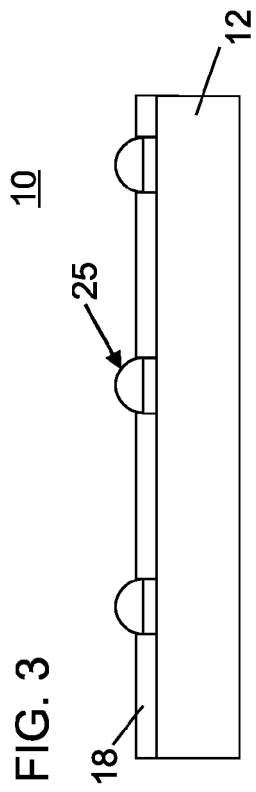
FIG. 3 is a side view of the wafer of FIG. 2 showing the underfill material removed from the raised electrodes and temporarily cured in accordance with the present principles.

Referring to FIG. 3, the underfill 18 is subjected to a temporary hardening process by subjecting the underfill 18 to a reflow at between 100 degrees C. to about 140 degrees C., and preferably about 125 degree C. for about 3 minutes. The underfill 18 is allowed to cool.

Figure 4:
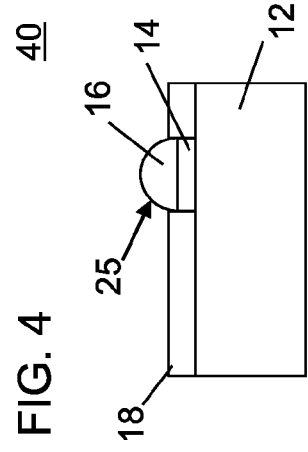
FIG. 4 is a side view of a chip diced from the wafer of FIG. 3 in accordance with the present principles.

Referring to FIG. 4, the wafer 10 is diced into individual chips 40. Each chip 40 includes its own electrodes 25, which will be employed in making electrical connections to other components.

Figure 5:
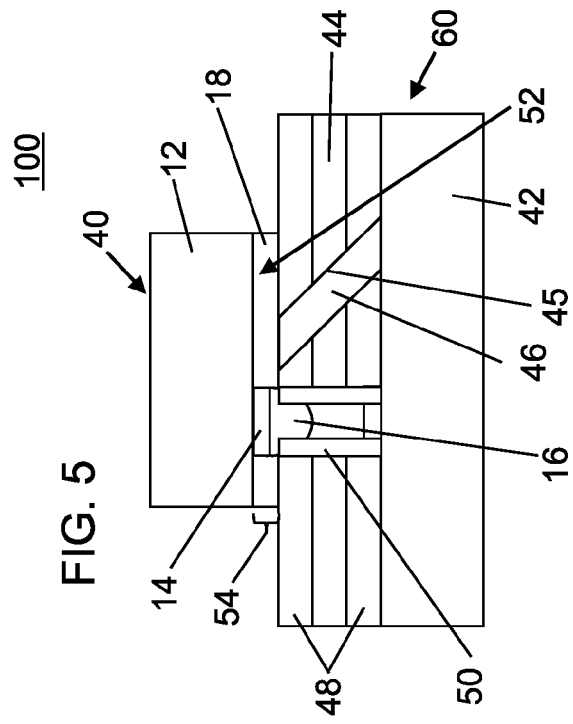
FIG. 5 is a cross-sectional view of an optical multi-chip module (MCM) including a cured underfill material adhering the chip of FIG. 4 to a waveguide module without interfering with a light cavity in the waveguide module in accordance with the present principles.

Referring to FIG. 5, a flip-chip assembly is performed to couple the chip 40 to a waveguide 44 formed on a substrate 42 to form an optical multi-chip module (MCM) 100. The substrate 42 may include an organic material. The waveguide 44 is formed between cladding layers 48. A contact connection 50 receives the electrode 25 therein and includes conductive material to create electrical connections to the chip 40. A light emitting or receiving region 52 on the chip 40 is aligned with a mirror 45. The mirror 45 such as a total internal reflection (TIR) mirror is employed to redirect light into the waveguide 44 from the light emitting or receiving region 52 of the chip 40. A cavity 46 for the mirror 45 may be formed by laser ablation to be at a 45 degree angle relative to the surface of the chip 40.

There are a number of reasons and advantages to having the mirror 45 on the mounting side of the chip 40. For example, the mirror 45 is provided in close proximity to the light emission position of the chip 40. Also, the chip 40 may be employed to cover the cavity 46 for the mirror 45.

Once the chip 40 is positioned, a curing process is performed, which may include adhesion of the underfill 18 by a reflow process. The reflow process may include subjecting the underfill to a temperature of between about 130 degrees C. to about 160 degrees C., preferably about 150 degrees C. for about 5 minutes. Then, a hardening process is performed at a temperature of between about 200 degrees C. and about 220 degrees C., preferably about 210 degrees C. for about 40 minutes. Solder bonding of the electrode 25 to the contact connection is performed by a 240 degrees C. to about 260 degrees C. solder reflow process.

By pre-coating the chip 40 with the underfill 18, the underfill 18 remains well-controlled. A thickness of the underfill 18 is controlled at its deposition and forms a highly controlled gap dimension 54. In addition, reflowing the underfill 18 does not permit the underfill material 18 to flow and fill in the cavity 46. Instead, the underfill 18 is softened and provides adhesion without the ill-effects of conventional devices, which fill the cavity and result in optical losses.

Since the underfill is pre-coated and cured in advance, there is no danger of filling mirror cavities. Air gaps between the chip 40 and the top cladding layer 48 are virtually eliminated between the chip 40 and the mirror 45. The present principles provide a low cost solution with a yield improvement for optical MCM manufacturing by preventing underfill 18 from entering TIR mirror cavities 46. The pre-coating with underfill 18 is concurrently provided on multiple optical devices by wafer-level processing.

The optical MCM 100 provides low power consumption (e.g., optical coupling loss reduction) since distance between the chip 40 and the waveguide 44 is reduced by underfill thickness control. In one embodiment, gap distances 54 of less than about 5 microns are provided. In addition, by including a uniform thickness of underfill 18, inclination of the chip 40 relative a waveguide module 60 is reduced or eliminated. In one embodiment, the chip 40 and waveguide cladding 48 surfaces are stuck together flat with the underfill 18 acting as an adhesive. This also improves the interfaces (and therefore light transmission) through the underfill 18.

While one embodiment depicts applying the underfill material to a wafer, other embodiments may apply the underfill material directly to a chip instead of the wafer. Processing is similar but employs one or more chips instead of the wafer.

Experiment: Underfill (18) was dispensed and cured on polymer waveguides for confirming adhesion and evaluating optical properties. In one process, a pre-coat of underfill on a glass substrate by a spin process (rotational speed of spin coater being 3000 rotations per minute (rpm)) was performed. A soft bake at 70 degrees C. for 90 seconds and a temporary cure at 125 degrees C. for 3 minutes were performed. Then, a waveguide-integrated substrate on glass was attached and fixed using a clip. An underfill adhesion includes 150 degrees C. for 5 minutes, and a cure at 210 degrees C. for 40 minutes.

Insertion loss measurement results were taken for the following two configurations. The first configuration included a waveguide and a glass substrate with index matching fluid (IMF) dispensed between a waveguide and a glass. The loss measured by a photodetector (1 cm) was −0.46 dB. The second configuration included a waveguide with underfill in accordance with the present principles. The loss measured by a photodetector (1 cm) was −0.40 dB with no insertion loss degradation after underfill cure (the 0.06 dB improvement is within the measurement error range). This means that no air layer existed between the waveguide and underfill.

In addition, the present principles do not require a lens or flexible printed circuit (FPC) between the chip 40 and the cavity 46. While no lens or FPC is needed, these components may be employed in some embodiments depending on the application. However, these components add costs and complexity to the manufacturing process.

Figure 6:
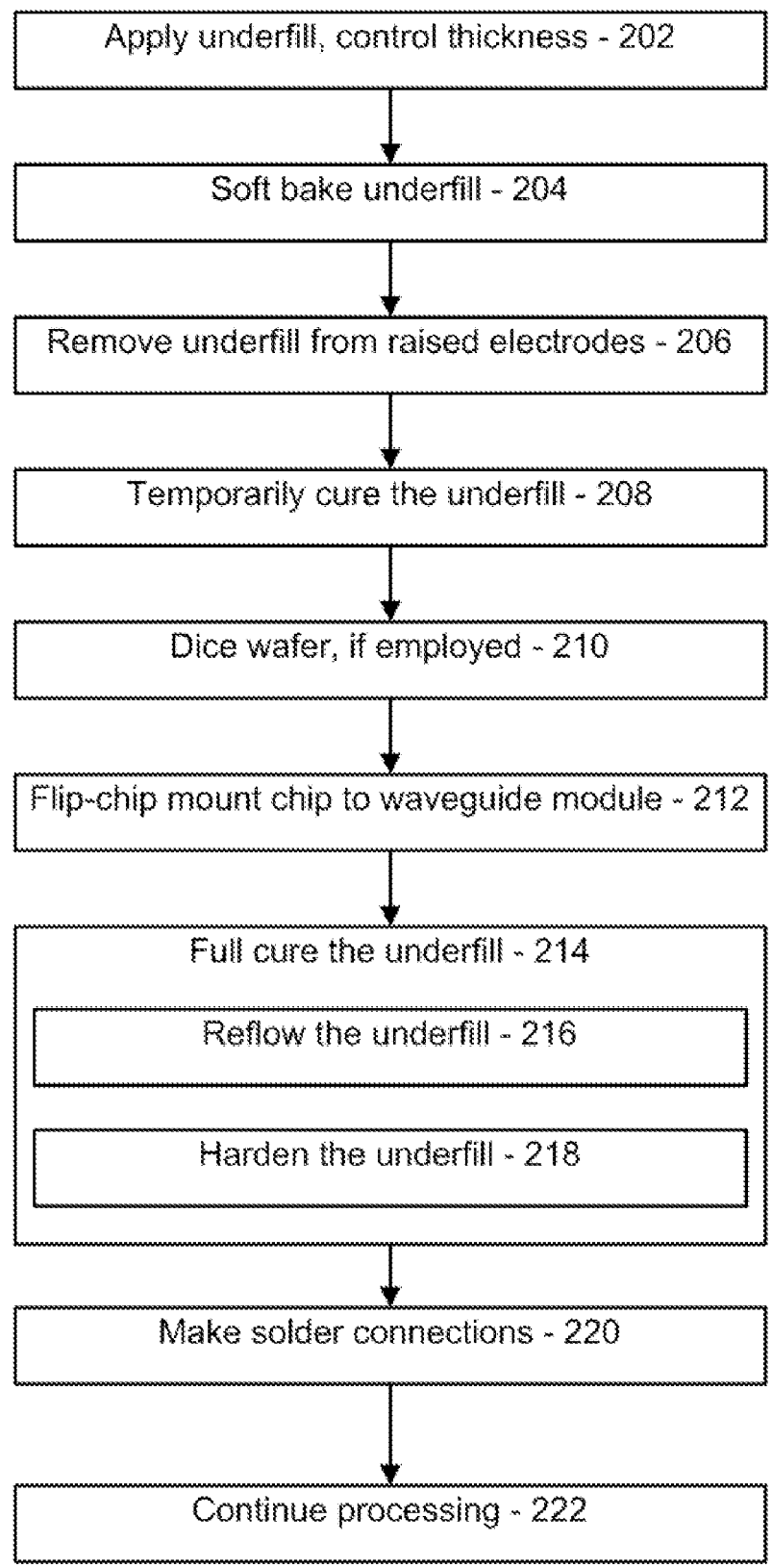
FIG. 6 is a block/flow diagram showing a method for forming an optical multi-chip module in accordance with illustrative embodiments.

Referring to FIG. 6, a method for fabricating an optical multi-chip module (MCM) is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, an underfill material is applied to a wafer or chip. This may include a spin-on process or other deposition process. The application of the underfill material is controlled to control a gap distance. The wafer includes chips. The chip or chips include optical devices, such as photodiodes and/or lasers. The underfill material includes a semi-curable and reflowable resin. Semi-curable refers to a material that is stable being partially (temporarily or semi-) cured and then can be fully cured at a later point. Reflowable refers to the material as being capable of melting and re-solidifying. In one embodiment, the underfill material includes a cyclotene resin.

In block 204, a soft bake may be performed to provide some structure to the underfill material. The soft bake may include, e.g., heating at 70 degrees C. for about 90 seconds. In block 206, the underfill material may be removed from raised electrodes formed on the wafer or chip. This may include a lithography process to expose the underfill material through a mask and remove/develop uncross-linked portions to expose the raised electrodes.

In block 208, the underfill material is temporarily cured on the wafer or chip to prevent flow of the underfill material. Temporary curing the underfill material may include hardening the underfill material at between 100 degrees C. to about 140 degrees C.

In block 210, if a wafer was employed, the wafer is diced or separated into chips. In block 212, the chip is flip-chip mounted on a waveguide module. The light emitting or receiving chip is aligned with a mirror for directing light from/to the chip. The underfill material is disposed between the chip and the waveguide module. Since the chip is pre-coated with a solid or hardened underfill material, the underfill material does not interfere with a cavity in the waveguide module by flowing into the cavity and causing light attenuation. The cavity may include a mirror and a waveguide depending on the design.

In block 214, the underfill material is fully cured to adhere the chip to the waveguide module. The full cure may include reflowing the underfill material at a temperature of between about 130 degrees C. to about 160 degrees C. to provide adhesion in block 216, and hardening the underfill material at a temperature of between about 200 degrees C. and about 220 degrees C. in block 218.

In block 220, solder joints are reflowed to make solder connections between the light emitting or receiving chip and the waveguide module. In block 222, processing may continue to complete the device/module.

Having described preferred embodiments for optical device with precoated underfill (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating an optical multi-chip module (MCM), comprising:
    temporarily curing an underfill material on a chip including at least one optical device to prevent flow of the underfill material into a mirror cavity;
    flip-chip mounting the chip on a waveguide module having a mirror for directing light to or from the chip, wherein the underfill material forms a gap, determined by the temporarily cured underfill material, between the chip and the waveguide module; and
    curing the underfill material to adhere the chip to the waveguide module, wherein the mirror cavity remains free of underfill material.

2. The method as recited in claim 1, wherein the underfill material includes a semi-curable and reflowable resin.

3. The method as recited in claim 1, wherein the underfill material includes a resin.

4. The method as recited in claim 1, wherein flip-chip mounting the chip includes soldering the chip to the waveguide module.

5. The method as recited in claim 1, wherein temporarily curing the underfill material includes hardening the underfill material at between 100 degrees C. to about 140 degrees C.

6. The method as recited in claim 1, further comprising spinning on the underfill material and removing the underfill material from chip electrodes.

7. The method as recited in claim 1, wherein curing the underfill material includes:
    reflowing the underfill material at a temperature of between about 130 degrees C. to about 160 degrees C. to provide adhesion; and
    hardening the underfill material at a temperature of between about 200 degrees C. and about 220 degrees C.

8. A method for fabricating an optical multi-chip module (MCM), comprising:
    depositing an underfill material over a wafer having a plurality of chips with raised electrodes, the plurality of chips including optical devices;
    removing the underfill material from the raised electrodes;
    temporarily curing the underfill material;
    dicing the wafer to separate the plurality of chips;
    flip-chip mounting the chip on a waveguide module having a mirror for directing light to or from the chip, wherein the underfill material forms a gap, determined by the temporarily cured underfill material, between the chip and the waveguide module; and
    curing the underfill material to adhere the chip to the waveguide module, wherein the mirror cavity remains free of underfill material.

9. The method as recited in claim 8, wherein the underfill material includes a semi-curable and reflowable resin.

10. The method as recited in claim 8, wherein the underfill material includes a resin.

11. The method as recited in claim 8, wherein flip-chip mounting the chip includes soldering the chip to the waveguide module.

12. The method as recited in claim 8, wherein temporarily curing the underfill material includes hardening the underfill material at between 100 degrees C. to about 140 degrees C.

13. The method as recited in claim 8, wherein depositing the underfill material includes spinning on the underfill material.

14. The method as recited in claim 13, further comprising controlling a thickness of the underfill material by controlling a spinning speed.

15. The method as recited in claim 8, wherein curing the underfill material includes:
    reflowing the underfill material at a temperature of between about 130 degrees C. to about 160 degrees C. to provide adhesion; and
    hardening the underfill material at a temperature of between about 200 degrees C. and about 220 degrees C.

16. The method as recited in claim 8, wherein removing the underfill material from the raised electrodes includes employing lithography to develop and remove the underfill material from the raised electrodes.

* * * * *